Figure 1:
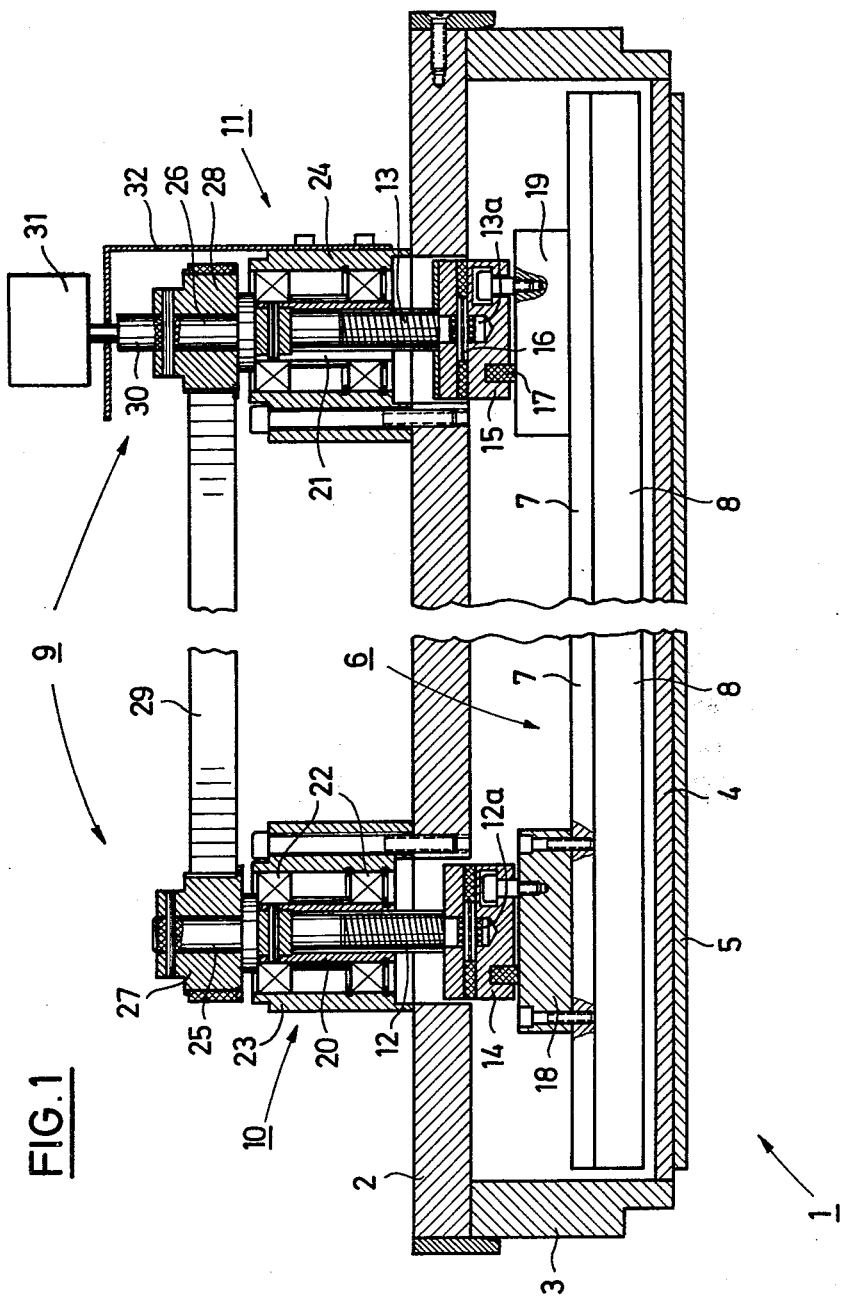

United States Patent [19]

Münz et al.

[11] 4,426,264

[45] Jan. 17, 1984

[54] METHOD AND MEANS FOR CONTROLLING SPUTTERING APPARATUS

[75] Inventors: Wolf-Dieter Münz, Freigericht; Hans Wolf, Erlensee, both of Fed. Rep. of Germany

[73] Assignee: Leybold Heraeus GmbH, Cologne, Fed. Rep. of Germany

[21] Appl. No.: 330,367

[22] Filed: Dec. 14, 1981

[30] Foreign Application Priority Data

Dec. 13, 1980 [DE] Fed. Rep. of Germany ....... 3047113

[51] Int. Cl.$^3$ ............................................. C23C 15/00
[52] U.S. Cl. .................................. 204/192 R; 204/298
[58] Field of Search ................ 204/192 R, 192 C, 298

[56] References Cited

U.S. PATENT DOCUMENTS

| 4,283,260 | 8/1981 | Thomas et al. | 204/192 R |
| 4,309,266 | 1/1982 | Nakamura et al. | 204/298 |

Primary Examiner—Aaron Weisstuch
Attorney, Agent, or Firm—Felfe & Lynch

[57] ABSTRACT

The invention concerns an array of cathodes for sputtering apparatus that contains first, a target plate made out of the material to be sputtered, second, a system of magnets with poles of opposite signs positioned behind the target plate so that at least some of the lines of magnetic force emerging from the poles pass through and reenter the target plate, and third, a device that can be adjusted to alter the relative positions of the magnets and the target plate. The array is also set up so that at least some of the magnetic lines of force run from the poles through the target plate and back.

The purpose of maintaining largely constant sputtering conditions as the target plate is consumed is achieved in accordance with the invention by moving the adjusting device essentially perpendicular to the largest surface of the target plate.

2 Claims, 2 Drawing Figures

METHOD AND MEANS FOR CONTROLLING SPUTTERING APPARATUS

The invention concerns a sputtering apparatus having a magnetic system for controlling its sputtering.

Such a sputtering apparatus is known from German Offenlegungsschrift No. 2 735 525, which departs from the prior art in which the relative positions of the magnet system and the target plate are constantly altered by keeping the former in continuous motion to obtain uniform attrition of the latter (page 5, paragraph 2). Because of the special purpose for which this known array is employed, the system of magnets moves parallel to the largest surface of the target plate. This admittedly is not intended to compensate for the effect on the sputtering process that occurs as the result of target-material attrition when the distance of the target surface to the central path of the lines of magnetic force slowly but constantly alters. Such an alteration leads to a constant change in sputtering conditions and hence in the properties of the sputter deposited layers. It has been observed for example that, as the target plate is increasingly consumed without external intervention, the sputtering voltage will decrease. One explanation of this effect is that, as the target plate surface is consumed and thus moves gradually into a region of greater magnetic field strength, it becomes more difficult for the electrons to escape from the trap formed by the field, leading to decreased plasma impedance or to increased charge-carrier density. Just keeping the voltage constant, however, does not solve the problem because this increases the discharging current and leads to a constant increase in the discharge rate, which is equally undesirable.

The invention is therefore intended as an improvement to the sputtering apparatus described in the introduction in which the sputtering conditions can be kept largely constant even as the target plate is increasingly consumed.

This improvement is obtained by moving the adjusting device essentially perpendiculr to the largest, sputtering surface of the target plate. The method of control, which is also an integral part of the invention, consists in moving the system of magnets parallel to the direction in which the residual surface of the target plate moves as it is increasingly consumed. Since sputtering does not remove material at all uniformly from the total target surface, by which is meant the front or sputtering surface facing the substrate to be plated, but rather from a circular area and in such a way as to leave a pit, as has been widely reported in the literature, the magnet system recedes essentially in accordance with a mean value that corresponds to the average attrition of the target material starting from the original front surface. Detecting the sputtering voltage and controlling the distance between the system of magnets and the target plate will automatically yield this mean formation.

In this way the effective surface of the target plate will always remain in an area of approximately constant magnetic field strength and the sputtering parameters can be maintained almost unchanged. This will have very positive results on the properties of layers applied in a number of sequential charges. It will also permit more of the target material to be utilized, reducing the cost of plating.

Other advantages of the invention will be evident from the subsidiary claims.

Figure 2:
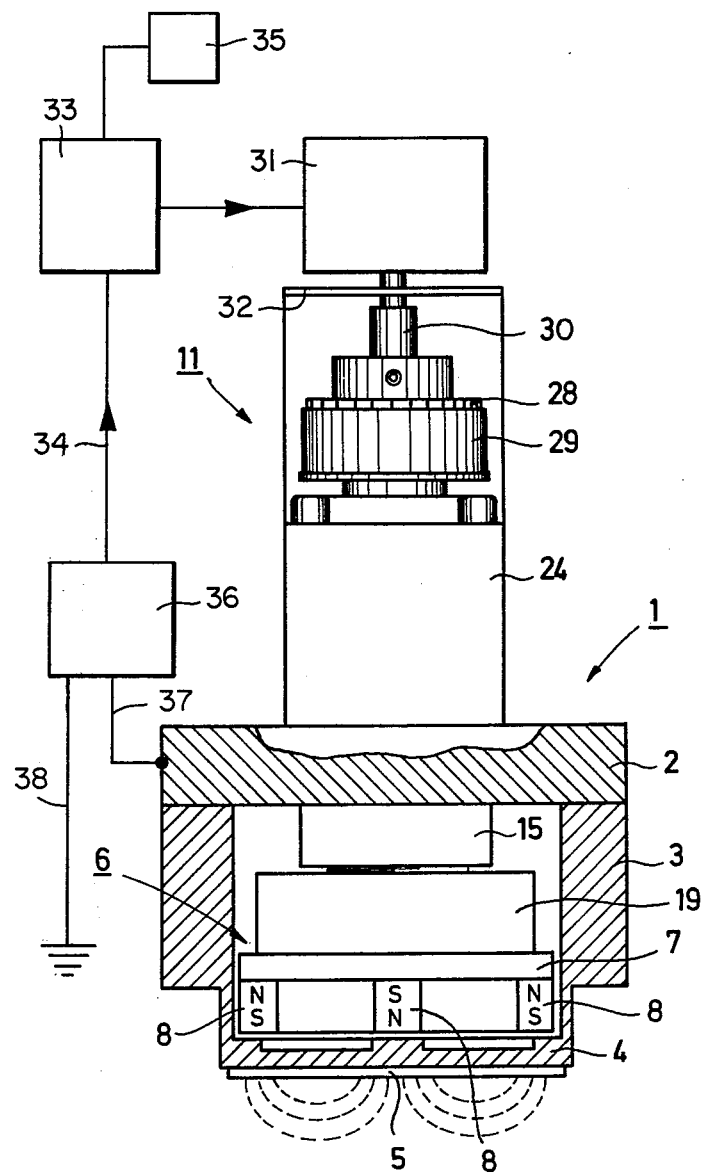

One embodiment of the invention will now be specified with reference to the drawings in which:

FIG. 1 is a longitudinal section through the larger plane of symmetry of a rectangular cathode; and FIG. 2 is a larger-scale section through approximately the middle of the cathode in FIG. 1.

FIG. 1 shows a cathode sputtering apparatus 1 with a ground plate 2 that forms a stationary reference mount for attaching it inside a vacuum chamber that is not shown. All components of the apparatus that are essential to its function are also attached to ground plate 2. These components include a pan 3 made of a nonmagnetic material like copper which is detachable from ground plate 2. A target plate 5, which is the source of plating material, is attached to the bottom 4 of pan 3, which parallels ground plate 2. Target plate 5 is made of a material that is to be deposited either in its pure form in an inert atmosphere or in a compound with a reactive sputtering gas, on a substrate, not shown, that faces the plate. Since the overall details of a sputtering apparatus of this type are typical of the state of the art, they will not be specified here.

In pan 3 is a system 6 of several permanent magnets 8 mounted on a holder 7 that parallels ground plate 2. FIG. 2 shows more details. Magnets 8 are arrayed, with their poles alternating, on the back of target plate 5. The magnets are positioned in relation to the target plate so that their lines of force run as shown by the dashed lines in FIG. 2, from the pole of one magnet, through the target plate, and back through the target plate in a curve to the pole of the next magnet. This arrangement generates what is called a magnetic tunnel, which not only allows the sputtering rate to be increased but also causes the target material to be removed faster inside the tunnel, especially in the middle.

FIG. 1 shows a control device 9 between magnet holder 7 and ground plate 2. This device employs two worm mechanisms 10 and 11, one at each end of ground plate 2, that rotate in the same sense.

Each worm mechanism has a threaded shaft 12 and 13. The bottom 12a, 13a of each shaft is fixed in a mounting 14, 15 by means of a grooved pin 16 and can not rotate. Mountings 14 and 15 can not rotate either and each is sealed with a gasket 17 to a base 18, 19 screwed into magnet holder 7.

Each threaded shaft 12, 13 is mounted in a nut 20, 21 that rotates in a ball bearing 22 in a housing 23, 24 that screws into ground plate 2.

A drive shaft 25, 26 engages with and is fixed to each nut 20, 21 by a grooved pin, to which no reference number has been assigned, so that the shafts and nuts will rotate together. A cogwheel 27, 28 is also fixed to and rotates with each drive shaft 25, 26. The two cogwheels 27 and 28 are connected by a toothed belt 29. Drive shaft 26 has an extension 30 with a servomotor 31 mounted on it. It will be practical for extension 30 to be long enough for the servomotor 31 to be outside the vacuum chamber. A shield 32 protects the operator of the set.

The servomotor, 31 obtains signals from a control circuit, 33 (FIG. 2) to which a voltage value proportional to the sputtering voltage is applied via line 34. The sputtering voltage is the potential difference between the cathode 1 obtained on line 37 and the relative ground of the vacuum chamber (not shown) in which the cathode is mounted, obtained on line 38. A power supply device 36 provides the voltage value proportional to the sputtering voltage so obtained to line 34. This voltage value is compared with a nominal voltage value from a reference voltage generator 35 and control device 9 regulated by servomotor 31 with respect to the algebraic sign of voltage deviation therebetween to keep the sputtering voltage as constant as possible.

The set as a whole has cold-water connections and coolant channels to handle any inertia temperature that may occur in operation.

We claim:

1. In a sputtering apparatus having a target plate from one side of which material is to be sputtered, magnetic means on the other side of the target plate for providing at least some lines of magnetic force which pass from and re-enter the one side of the target plate, and positioning means relatively spacing the target plate and the magnetic means for varying the magnetic force passing from and re-entering the one side of the target plate, a method of maintaining substantially constant sputtering parameters, comprising:

obtaining a voltage value proportional to the sputtering voltage;

comparing the obtained voltage value with a nominal voltage value for determining the algebraic sign of any voltage deviation therebetween; and operating the positioning means in response to the determined deviation for spacing the target plate and magnetic means relatively such that the determined deviation is reduced.

2. In a sputtering apparatus having a target plate from one side of which material is to be sputtered, magnetic means on the other side of the target plate for providing at least some lines of magnetic force which pass from and re-enter the one side of the target plate, and positioning means relatively spacing the target plate and the magnetic means for varying the magnetic force passing from and re-entering the one side of the target plate, the improvement comprising means for maintaining substantially constant sputtering parameters, comprising:

means for obtaining a voltage value proportional to the sputtering voltage;

means for comparing the obtained voltage value with a nominal voltage value for determining the algebraic sign of any voltage deviation therebetween; and means for operating the positioning means in response to the determined deviation for spacing the target plate and magnetic means relatively such that the determined deviation is reduced.

* * * * *